United States Patent [19]
Avellino et al.

[11] Patent Number: 4,925,522
[45] Date of Patent: May 15, 1990

[54] PRINTED CIRCUIT ASSEMBLY WITH CONTACT DOT

[75] Inventors: Frank J. Avellino, Russell; Richard A. Case, Pittsfield; David T. Swanson, Warren, all of Pa.

[73] Assignee: GTE Products Corporation, Stamford, Conn.

[21] Appl. No.: 396,257

[22] Filed: Aug. 21, 1989

[51] Int. Cl.⁵ ............................................. H05K 3/06
[52] U.S. Cl. ..................... 156/632; 156/634; 156/664; 156/666; 156/901; 156/902; 156/630; 228/254
[58] Field of Search ............... 156/630, 634, 656, 666, 156/901, 902, 664, 632; 427/96; 228/254; 428/458

[56] References Cited
U.S. PATENT DOCUMENTS

| | | | |
|---|---|---|---|
| 3,382,575 | 5/1968 | Gannoe | 29/879 |
| 3,728,178 | 4/1973 | Caule | 156/630 |
| 4,404,509 | 9/1983 | Livshits et al. | 156/902 |
| 4,543,153 | 9/1985 | Nelson | 156/666 |

Primary Examiner—Kenneth M. Schor
Assistant Examiner—Todd J. Burns
Attorney, Agent, or Firm—William H. McNeill

[57] ABSTRACT

A method of making printed circuit boards having gold dot contacts formed on the terminal pads is disclosed. A first layer of copper is overlayed with a pattern of tin or solder which acts as a resist. The gold dot contacts are resistance welded to the terminal pads. The copper underlayment and its pattern of tin or solder carrying the gold dots is then bonded to an electrically insulating substrate, which can be flexible, to form a composite board which is then etched to form a printed circuit board having gold dot contacts thereon. Other materials than tin or solder can be employed so long as there is a difference in etchability between it and the copper foil.

12 Claims, 2 Drawing Sheets

PRINTED CIRCUIT ASSEMBLY WITH CONTACT DOT

TECHNICAL FIELD

This invention relates to printed circuit boards and more particularly to flexible printed circuit boards. Still more particularly, it relates to such boards having a contact dot or dots as particular locations thereon.

BACKGROUND ART

Printed circuit boards comprise electrically insulating substrates having electrically conductive patterns thereon. Additional components, such as transistors or integrated circuit devices may be mounted upon the boards. In use the boards are frequently mated with connectors having a plurality of contacts therein. To insure effective electrical conductivity the conductive portions of the board and/or the contacting parts of the contacts are often gold plated. As regards the contacts in the connectors, it has been suggested that a gold dot be placed at the contact point. See, e.g., U.S. Pat. Nos. 3,114,828; 3,382,575; and 4,403,411. However, it has not previously been possible to provide such a discrete contact point on the printed circuit boards because of the insulating substrate and the fact that the discrete dots were applied by resistance welding, a technique made impossible by the insulating substrate.

SUMMARY OF THE INVENTION

It is therefore an object of the invention to obviate the disadvantage of the prior art.

It is another object of the invention to provide an enhanced method of fabricating printed circuit boards.

It is yet another object of the invention to provide a method of applying discrete amounts of contact material to specific areas of printed circuit board pads.

Still another object is the provision of such a method that is economical.

These objects are accomplished, in one aspect of the invention, by the provision of a method of applying discrete areas of a noble metal to individual pads on a printed circuit board comprising the steps of preparing a given size, flexible sheet of etchable, electrically conductive foil from a first material; applying thereto a particular pattern of an electrically conductive, second material which is relatively non-etchable and which includes a number of individual pads; applying at least one discrete area of a noble metal to at least one of said individual pads; bonding said first material with its particular pattern and noble metal areas to an electrically insulating substrate to form a composite board; and etching said composite board to remove undesired portions of said etchable material to form said printed circuit board having discrete areas of noble metal thereon.

There is thus provided a printed circuit board having discrete, noble metal areas at the contact points thereof.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
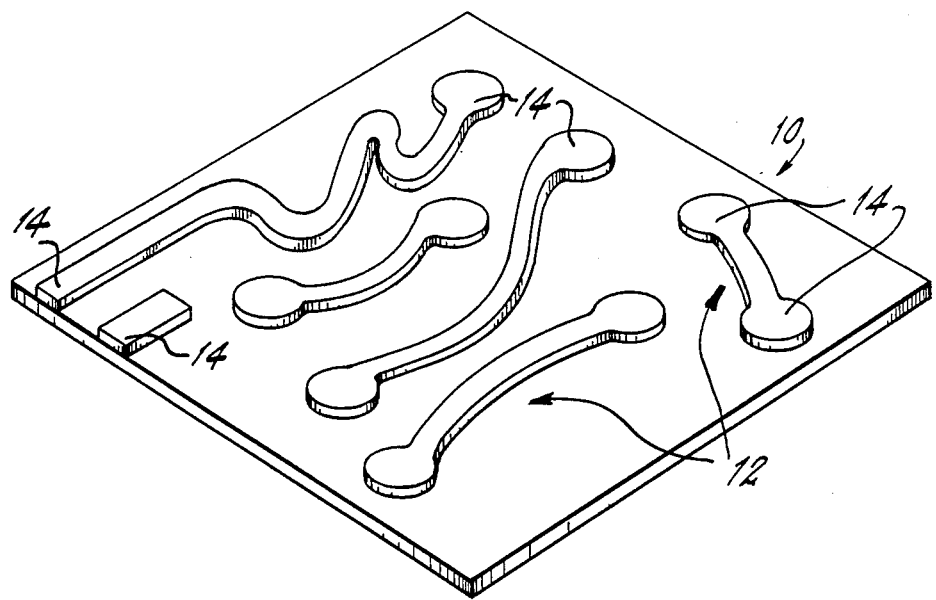
FIG. 1 is a perspective view of a first step in the operation of the invention.
Figure 2:
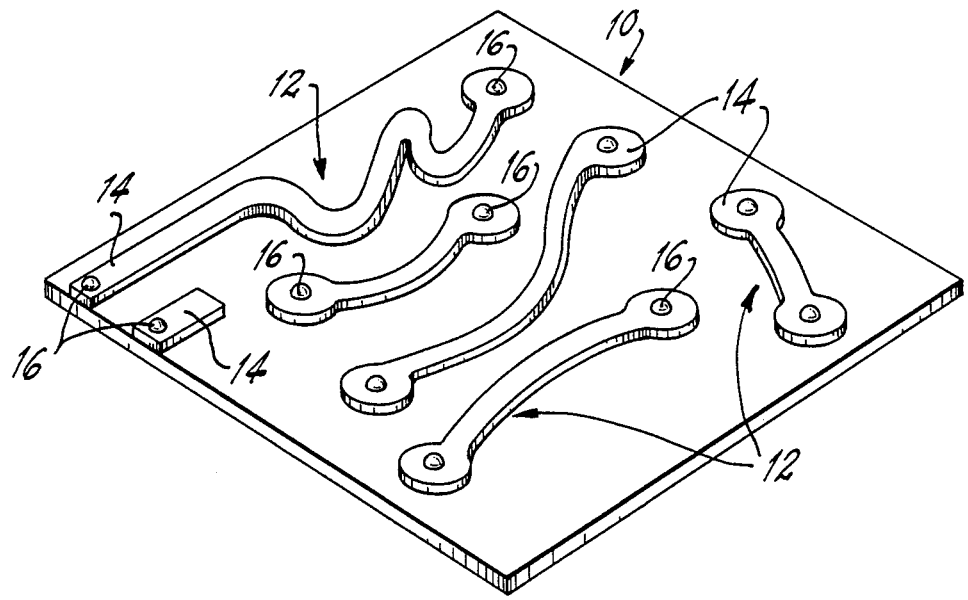
FIG. 2 is a perspective view of a second step in the operation of the invention.

Referring now to the drawings with greater particularly, there is shown in FIG. 1 a sheet 10 of a first flexible, electrically conductive, etchable foil such as one or two oz. copper. A particular pattern 12 of a second flexible, electrically conductive material which is relatively non-etchable is affixed to the sheet 10 as by silk screening or electoplating. The pattern 12 includes a number of individual pads 14 and can be comprised of, for example, tin or solder.

Contact points 16 are provided on the individual pads 14, and are preferably formed from a noble metal such as gold or silver or an alloy thereof. An alloy of 70% gold, remainder silver is preferred. The discrete areas or dots can be applied by resistance welding a wire of the noble metal to the individual pads; cutting off the wire; and then coining the same. Such a technique is shown in U.S. Pat. Nos. 3,114,828 and 3,382,575, the teachings of which are hereby incorporated by reference.

Figure 3:
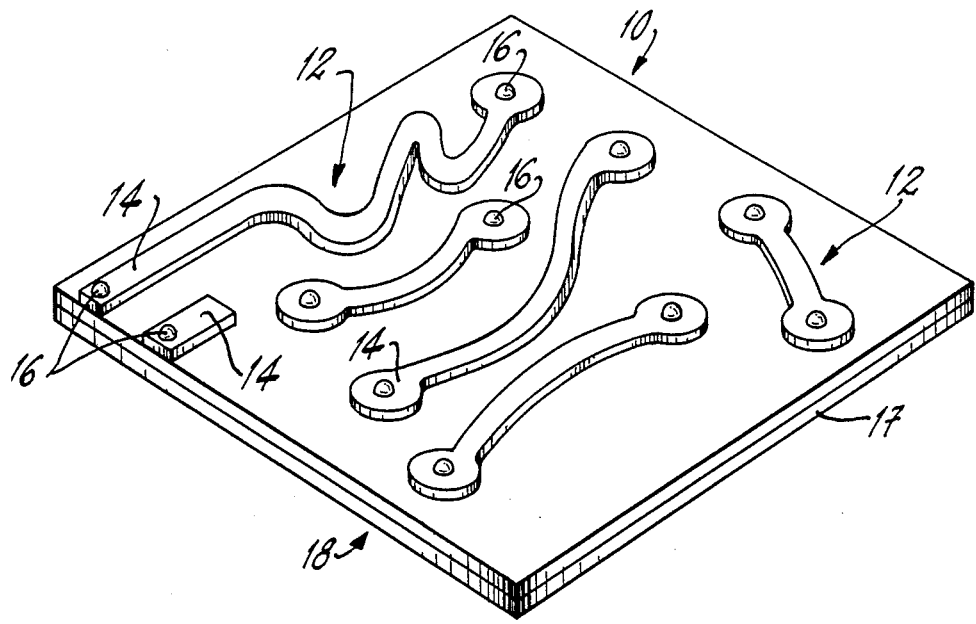
FIG. 3 is a perspective view of a composite board.

Upon application of the desired number of discrete areas 16 the sheet 10 is bonded to an electrically insulating substrate 17, which can be flexible, such as Kapton, which is a material available from DuPont. The bonding material can be acrylic or modified epoxy. This operation forms a composite board 18, as shown in FIG. 3.

Figure 4:
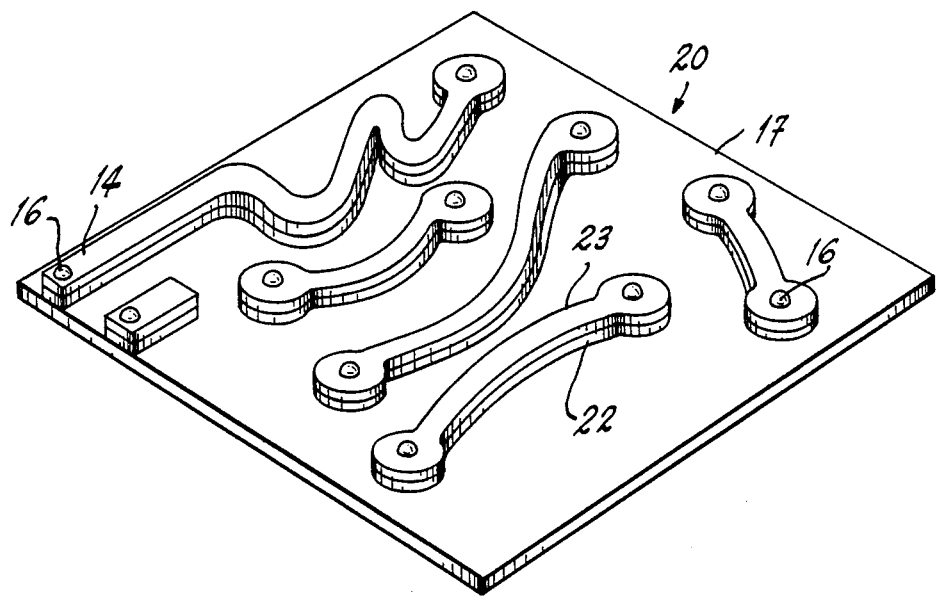
FIG. 4 is a perspective view of a finished printed circuit board made in accordance with the ivention.

The composite board 18 is then etched in a solution of ferric chloride. Since the second material, i.e., the tin or solder, is relatively non-etchable, it acts as a resist and is not removed by the etching solution. The noble metal also is relatively impervious to the action of the etching solution; therefore, upon completion of the etching action, the printed circuit board 20 of FIG. 4 is formed. The pattern 12 now comprises a layer of copper 22 which is covered by the electrically conductive resist 23, e.g., tin or solder. which has welded thereto the discrete areas or dots 16 of noble metal. The substrate 17 can be flexible, in which case the entire board fits the description of a flexible printed circuit board, or it can be relatively rigid. The noble metal dot, which preferably has a thickness of from 0.088 to 0.010 inches has a much longer life expectancy than a noble metal coating or plating which would normally have a thickness measured in microinches.

Accordingly, there is here provided a novel method of making printed circuit boards having discrete areas of noble metal contact points thereon. These contact areas exhibit long life and excellent electrical conductivity.

While there have been shown and described what are at present considered to be the preferred embodiments of the invention, it will be apparent to those skilled in the art that various changes and modifications can be made herein without departing from the scope of the invention as defined by the appended claims.

We claim:

1. A method of applying discrete areas of a noble metal to individual pads on a flexible printed circuit board comprising the steps of:
   (a) preparing a given size, flexible sheet of etchable, electrically conductive foil from a first material;

(b) applying to said first material, a particular pattern of an electrically conductive, second material which is relatively non-etchable as compared with the etchability of the first material and which second material includes a number of individual pads;

(c) resistance welding at least one discrete area of a noble metal to at least one of said individual pads;

(d) bonding said first material with its particular pattern and noble metal areas to a flexible, electrically insulating substrate to form a composite board; and (e) etching said composite board to remove undesired portions of said etchable material which are not masked by said pattern to thereby form said flexible printed circuit board having discrete areas of noble metal thereon.

2. The method of claim 1 wherein said first material is copper.

3. The method of claim 2 wherein said second material is selected from the group consisting of tin and solder.

4. The method of claim 3 wherein said noble metal is an alloy of gold and silver.

5. The method of claim 4 wherein said alloy comprises 70% gold.

6. The method of claim 5 wherein said etching is carried out in a solution of ferric chloride.

7. A method of applying discrete areas of a noble metal to individual pads on a printed circuit board comprising the steps of:

(a) preparing a given size, flexible sheet of etchable, electrically conductive foil from a first material;

(b) applying to said first material, a particular pattern of an electrically conductive, second material which is relatively non-etchable as compared with the etchability of the first material and which second material includes a number of individual pads;

(c) resistance welding at least one discrete area of a noble metal to at least one of said individual pads;

(d) bonding said first material with its particular pattern and noble metal areas to an electrically insulating substrate to form a composite board; and (e) etching said composite board to remove undesired portions of said etchable material which are not masked by said pattern, to thereby form said printed circuit board having discrete areas of noble metal thereon.

8. The method of claim 7 wherein said first material is copper.

9. The method of claim 8 wherein said second material is selected from the group consisting of tin and solder.

10. The method of claim 9 wherein said noble metal is an alloy of gold and silver.

11. The method of claim 10 wherein said alloy comprises 70% gold.

12. The method of claim 11 wherein said etching is carried out in a solution of ferric chloride.

* * * * *